(12) United States Patent
Norman

(10) Patent No.: US 6,304,204 B1
(45) Date of Patent: Oct. 16, 2001

(54) ERROR CORRECTION ARCHITECTURE FOR PIPELINE ANALOG TO DIGITAL CONVERTERS

(75) Inventor: Orhan Norman, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/546,992

(22) Filed: Apr. 11, 2000

Related U.S. Application Data

(63) Continuation of application No. 08/975,435, filed on Nov. 20, 1997.

(51) Int. Cl.$^7$ .................................................. H03M 1/38
(52) U.S. Cl. ............................................ 341/161; 341/118
(58) Field of Search .................................. 341/161, 163, 341/155, 118

(56) References Cited

U.S. PATENT DOCUMENTS

| | | | |
|---|---|---|---|
| 4,375,059 | 2/1983 | Schlig | 340/347 |
| 4,379,285 | 4/1983 | Dooley | 340/347 |
| 5,043,732 | * 8/1991 | Robertson et al. | 341/156 |
| 5,057,841 | * 10/1991 | Veerhoek et al. | 341/156 |
| 5,296,856 | * 3/1994 | Mantong | 341/139 |
| 5,412,385 | 5/1995 | Mangelsdorf | 341/120 |
| 5,416,485 | 5/1995 | Lee | 341/172 |
| 5,459,465 | * 10/1995 | Kagey | 341/156 |
| 5,499,027 | 3/1996 | Karanicolas et al. | 341/120 |
| 5,510,789 | 4/1996 | Lee | 341/120 |
| 5,534,864 | * 7/1996 | Ono et al. | 341/156 |
| 5,572,212 | 11/1996 | Levinson et al. | 341/162 |
| 5,861,828 | 1/1999 | Opris | 341/120 |
| 5,867,116 | * 2/1999 | Nakamura et al. | 341/159 |

FOREIGN PATENT DOCUMENTS

| | | | |
|---|---|---|---|
| 0214831 A3 | 3/1987 | (EP) | H03M/1/40 |
| 1 523 123 | 8/1978 | (GB) | H03K/13/02 |
| 2 223 137 | 3/1990 | (GB) | H03M/1/40 |

OTHER PUBLICATIONS

"A 10–b 20–Msample/s Analog–to–Digital Converter", IEEE Journal of Solid–State Circuits, vol. 27 No. 3, Mar. 1992.

"A 12–b 600 ks/s Digitally Self–Calibrated Pipelined Algorithmic ADC", IEEE Journal of Solid–State Circuits, Apr. 1994.

"A 15–b 1–Msample/s Digitally Self–Calibrated Pipeline ADC", IEEE Journal of Solid–State Circuits, Dec. 1993.

"Clever Designs Spawn 40–MHz/10–Bit/0.2–W ADCs", Electronic Design, Jan. 1994.

* cited by examiner

Primary Examiner—Peguy Jeanpierre
(74) Attorney, Agent, or Firm—Sierra Patent Group, LLC Seong-Kon Oh

(57) ABSTRACT

A pipeline analog to digital converter architecture includes at least two error correction stages, one such error correction stage at the end of the pipeline architecture such that power savings and silicon area optimization are achieved by tailoring the performance of the pipeline stages towards the end of the pipeline architecture. The other error correction stages are placed with respect to the overall design sensitivities. The design according to the present invention is applicable to a broad class of pipeline architectures including multi-bit stages in the pipeline architecture.

14 Claims, 6 Drawing Sheets

S8　S7　S6　S5　S4　S3　S2　S1

S8　S7　S6　S5　S4　S3　S2　S1

ERROR CORRECTION ARCHITECTURE FOR PIPELINE ANALOG TO DIGITAL CONVERTERS

This application is a continuation of 08/975,435 filed Nov. 20, 1997.

BACKGROUND OF THE INVENTION

1. Field of the Invention

The present invention generally relates to analog to digital converters. More particularly, the present invention relates to a method and an apparatus for error correction in pipeline analog to digital converter architecture.

2. Description of the Related Art

Analog-to-digital (A/D) converters with pipeline architecture are well suited for low-power, high speed applications. Among the several of the currently used high conversion speed techniques such as flash, multi-step, pipeline, interpolating, and time-interleaved successive approximation, the pipeline technique offers the best trade-off between minimizing circuit complexity, silicon area, and power consumption with respect to conversion speed. Pipeline architecture can generally provide high throughput rates and occupy small die areas which are both desirable and cost efficient in A/D converters. These advantages result from the concurrent operation of each of the multiple stages in the pipeline architecture.

Broadly speaking, at any given time during the operation of the pipelined A/D converter, the first stage operates on the most recent sample inputted while subsequent stages operate on residues from the previous samples outputted from prior stages of the cascaded pipeline architecture.

In addition, a redundancy in stage bit resolution can be introduced to provide sufficiently large tolerance for non-ideal component characteristics. In particular, by providing more resolution per stage such that the sum of the individual stage resolutions is greater than the total resolution of the output digital signal, and by eliminating this redundancy with a digital correction algorithm, the effects of quantizer nonlinearity, comparator offset and incomplete settling on the overall linearity can be significantly improved.

FIG. 1 illustrates a conventional approach in determining the digital word corresponding to an analog input signal in a pipeline A/D converter architecture using 1 bit per stage. As shown, the input signal range 101 is divided into two subsection ranges 102, 103. Then, a comparator (not shown) determines into which of the two ranges 102, 103 the input signal falls, thus ascertaining the most significant bit MSB of the digital word. Upon determining the most significant bit MSB, the halved subsection range 102 containing the input signal is re-centered and amplified by two. Then, the halved subsection range 102 is again divided into two subsections 104, 105 and another comparator (not shown) determines into which half of the new subsections 104, 105 the signal falls. As can be seen from FIG. 1, the above-described steps are continuously executed. In this manner, the digital word corresponding to the analog input signal is determined one bit at a time, starting with the most significant bit MSB.

In practice, however, splitting the signal range into two results in inaccuracy due to comparator offsets, settling time errors and other errors inherent in pipeline architecture. These errors, when substantially significant, cause a wrong decision to be made at a particular stage along the pipeline architecture.

FIG. 2 illustrates the effect of the inaccuracy resulting in such errors. The solid dot indicates the location of the input signal during the various stages along a 1-bit per stage pipeline architecture. Also shown in FIG. 2 are over-range (OR) and under-range (UR) regions of the pipeline architecture.

It can be seen from FIG. 2 that the input signal at first stage 10 is close to the threshold of the first comparator (not shown) shown by the proximity of the solid dot (residing in section 203) to line 201. Due to the comparator offset, incomplete settling time or other error-causing factors as previously discussed, the comparator switches the wrong section 202 (i.e., the range which does not contain the input signal) to the second stage 20, amplified by a gain of two (2). As a result, the input signal ends up in the over-range region (OR).

Then, two types of corrections need to be carried out: analog and digital corrections. The analog correction is achieved by switching the over-range region (OR) to the third stage 30 of the pipeline architecture so that the signal is brought back into the normal range, while the digital correction is achieved by adding a "1" where the over-range condition (i.e., stage 20 of the pipeline architecture) is detected. In case of under-range condition, rather than adding a "1" as in the over-range condition, a "1" is subtracted.

For example, as shown in FIG. 2, in the first stage 10 of the pipeline architecture, each section 202, 203 between the over-range region (OR) and the under-range region (UR) corresponds to one local quantization step of the first stage 10, or two quantization steps in second stage 20 (where 1 bit equals two quantization steps). By erroneously switching section 202 from first stage 10 to second stage 20, an error results that is effectively equal to a negative quantization step (one half bit) in the first stage 10.

Generally, the errors discussed herein are relatively small in magnitude, spanning over a few least significant bits (LSBs). Therefore, error correction in the first few stages generally are not necessary, and such correction can wait until the magnitude of the error is comparable to, but less than, the local quantization step.

FIG. 3 illustrates the relative size of the error and the location of necessary error correction. As with the illustration of FIG. 2, the solid dot indicates the location of the input signal at various stages in the pipeline architecture with OR indicating the over-range region. Employing a similar amplification and subdivision of signal ranges as explained above with FIG. 2, it can be seen from FIG. 3 that the first stage 301 (not necessarily the first stage of the pipeline A/D converter architecture) makes an error that is within two local quantization steps in the fourth stage 304. In this manner, an error in the first stage 301 continues to magnify through each successive stages (stage 301 to 304) of the pipeline architecture when no error correction is implemented.

Furthermore, it can be seen from FIG. 3 that the input signal enters the over-range region at the second stage 302. If this error is directly passed onto the third stage 303, correction can still be achieved by adding a "1" at this stage (i.e., stage 303) since the input signal in the over-range region is within one local quantization step of the normal range. However, if the error is further passed onto the fourth consecutive stage 304 without correction in any of the intermediate stages (stages 302 or 303), then, the input signal is more than one local quantization step into the over-range region OR. The addition of a "1" at the fourth stage 304 in this case will not be sufficient to correct the error. Therefore, in order to implement effective error correction at stage 304, rather than adding a "1", a "2" is added at the fourth stage 304, which is equivalent to adding a "1" in the third stage 303. It is to be noted, however, that if error correction is implemented at stage 304 instead of at stage 303, a further provision is necessary to add/subtract a "1" as well as a "2" at stage 304. (A smaller error could fall within one quantization step of the normal range).

Assuming that the approach as described in FIG. 3 represents the maximum error toleration for a pipeline A/D converter architecture, in practical implementation, all stages prior to the third stage 303 can skip error correction. This is the approach suggested in Hadidi et al., "Error analysis in pipeline A/D converters and its applications", IEEE Transaction on Circuits and Systems II, vol. 39, No.8, August 1992.

According to the Hadidi approach, the location of the error correction stage along the pipeline architecture is generally determined by the maximum comparator offset and settling errors. Moreover, any other offset error resulting after the error correction stage results in an input referred error which is less than one LSB—an indication that the error is not corrected. In other words, when such errors are referred to the input signal through the interstage gains, they are, in theory, smaller than the least significant bit.

The Hadidi approach described above presents several limitations. First, it is not practically feasible to determine the comparator offset exactly prior to fabrication. Additionally, settling errors may not be sufficiently characterized. Therefore, the location of the error correction stage must be determined very conservatively. As a result, any offset error occurring after the error correction stage may not be less than one LSB when compared to the input signal. This, in turn, translates into uncorrected offset errors in the pipeline architecture which will lead to inaccuracies in analog to digital conversion.

Moreover, even if offsets beyond the error correction stage cause less than one LSB error, if these post-error correction stage offsets are uncorrected, they adversely affect the permissible differential nonlinearity (DNL) of the pipeline architecture. Also, when a single error correction stage is used as in the Hadidi approach, the additional comparators that detect over-range conditions have to be precise. Otherwise, these offsets of the over-range comparators will contribute to the existing errors (the contribution from these comparators, of course, is scaled by the interstage gains).

Additionally, as an offset error passes through the stages in the pipeline architecture without being corrected, due to the interstage gain, the signal moves further away from the normal range as shown in FIG. 3. Generally, the interstage gain blocks are designed to be linear in the normal operational range. However, the linearity of these interstage gain blocks degrades significantly as the over-range signal increases. Thus, even though the accumulated error is correctable at the chosen location for the error correction stage, there will be substantial distortion of the offset error resulting in further degradation of the differential non-linearity (DNL). Accordingly, it may be necessary to choose an error correction level which is less than one local quantization step.

Therefore, determining the location of the error correction stage from the perspective of comparator offset does not yield the optimum design when the accumulated errors push the limits of the interstage amplifiers' linearity for a given power dissipation.

SUMMARY OF THE INVENTION

In view of the foregoing, the present invention is directed to providing flexibility and optimization in the pipeline A/D converter design by implementing an "accumulate and dump" approach for error correction. In this manner, rather than waiting until the theoretical error correction location to correct the offset and allowing the accumulation of the offset errors far into the over-range region, the present invention employs a pre-determined periodical correction of the offset and settling errors.

Accordingly, the brute force approach of implementing error correction at every stage is avoided. Moreover, with the last stage of the pipeline architecture being an error correction stage, simpler design of pipeline sections towards the end of the pipeline is achieved while avoiding the accumulation of unnecessary differential linearity errors. Therefore, in accordance with the present invention, power savings and silicon area optimization is achieved.

An apparatus including an error correction stage in a pipeline analog to digital converter, in accordance with one embodiment of the present invention includes an input terminal for receiving an input signal; and a plurality of stages including a first stage coupled to said input terminal and a last stage, each of said plurality of stages including an additive error level and a local error correction level, said last stage configured to be a first error correction stage; where said additive error level of said each subsequent stage from said first stage is accumulated and compared with said local error correction level at each stage until said accumulated error level exceeds said local error correction level in one of said stages so that said stage immediately prior to said one stage in which said accumulated error level exceeds said local error correction level is configured to be another error correction stage and said accumulated error level is initialized to zero; and further where said error level accumulation, said comparison with said local error correction level at said each stage, said configuration of said stage immediately prior to said another stage in which said accumulated error level exceeds said local error correction level as yet another error correction stage, and said initialization of said accumulated error level are repeated until said last stage.

An apparatus including an error correction stage in a pipeline analog to digital converter in accordance with another embodiment of the present invention includes an input terminal for receiving an input signal; an output terminal; a signal detection circuit coupled to the input terminal for detecting the input signal relative to a predetermined signal range and in accordance therewith, generating a plurality of detection signals; and a signal controller coupled to said input terminal, said output terminal and said signal detection circuit; where the plurality of detection signals includes one or more upper range detection signals, one or more under range detection signals and an in-range detection signal such that the signal controller selectively receives one of the upper range, under range or in-range detection signals and in accordance therewith, provides an output signal to the output terminal.

A signal detection circuit in the apparatus including an error correction stage in a pipeline analog to digital converter in accordance with another embodiment of the present invention includes a first upper range detection circuit for detecting a first upper range condition and in accordance thereto generating a first upper range detection signal; and a first under range detection circuit for detecting a first under range condition and in accordance thereto generating a first under range detection signal; where said one or more upper range detection signals includes the first upper range detection signal and said one or more under range detection signals includes the first under range detection signal; and further where the first upper range condition is defined by one of the input signal above the predetermined signal range, and the first under range condition is defined by another of the input signal below the predetermined signal range.

A signal detection circuit including an error correction stage in a pipeline analog to digital converter in accordance with still another embodiment of the present invention includes a second upper range detection circuit for detecting a second upper range condition and in accordance thereto generating a second upper range detection signal; and a second under range detection circuit for detecting a second under range condition and in accordance thereto generating a second under range detection signal; where said one or more upper range detection signals includes the second upper range detection signal and said one or more under range detection signals includes the second under range detection signal; and further, where the second upper range condition is defined by one of the input signal above the first upper range detection signal, and the second under range condition is defined by another one of the input signal below the first under range detection signal.

A method of optimizing an analog to digital converter architecture in accordance with one embodiment of the present invention includes the steps of: receiving a plurality of converter design parameters of an analog to digital converter having a plurality of stages including a first stage and a last stage said first stage being an input stage for receiving an input signal, each stage having an additive error level and a local error correction level; adding said additive error level from each of said plurality of stages including said first stage to generate a cumulative error; determining, for each stage of said converter except said last stage, whether said cumulative error is within said local error correction level of each of said stages; configuring, when said cumulative error is not within the local error correction level of said stage, a preceding stage of said stage as an error correction stage; and configuring the last stage in said plurality of stages of said converter as an error correction stage; where said additive error level of said each subsequent stage from said first stage is accumulated and compared with said local error correction level at each stage until said accumulated error level exceeds said local error correction level in one of said stages so that said stage immediately prior to said one stage in which said accumulated error level exceeds said local error correction level is configured to be another error correction stage and said accumulated error level is initialized to zero; and further wherein said error level accumulation, said comparison with said local error correction level at said each stage, said configuration of said stage immediately prior to said another stage in which said accumulated error level exceeds said local error correction level as yet another error correction stage, and said initialization of said accumulated error level are repeated until said last stage.

A method of error correction in a pipeline analog to digital converter in accordance with another embodiment of the present invention includes the steps of receiving an input signal; detecting the input signal relative to a predetermined signal range and in accordance thereto, generating a plurality of detection signals, the plurality of detection signals including an upper range detection signal, an under range detection signal and an in-range detection signal; and selectively receiving one of the upper range, under range or in-range detection signals and in accordance thereto, providing an output signal.

A detection step in a method of error correction in a pipeline analog to digital converter in accordance with another embodiment of the present invention includes the steps of detecting a first upper range condition and in accordance thereto generating a first upper range detection signal; and detecting a first under range condition and in accordance thereto generating a first under range detection signal; where the upper range detection signal includes the first upper range detection signal and the under range detection signal includes the first under range detection signal; and further, where the first upper range condition is defined by one of the input signal above the predetermined signal range, and the first under range condition is defined by another one of the input signal below the predetermined signal range.

A detection step in a method of error correction in a pipeline analog to digital converter in accordance with yet another embodiment of the present invention includes the steps of detecting a second upper range condition and in accordance thereto generating a second upper range detection signal; and detecting a second under range condition and in accordance thereto generating a second under range detection signal; where the upper range detection signal includes the second upper range detection signal and the under range detection signal includes the second under range detection signal; and further, where the second upper range condition is defined by one of the input signal above the first upper range detection signal, and the second under range condition is defined by another one of the input signal below the first under range detection signal.

These and other features and advantages of the present invention will be understood upon consideration of the following detailed description of the invention and the accompanying drawings.

DESCRIPTION OF THE PREFERRED EMBODIMENT

Figure 1:
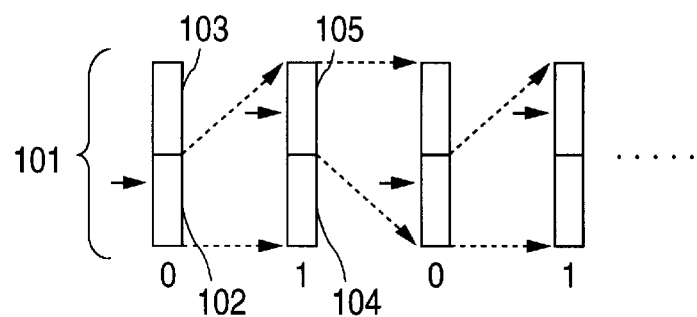
FIG. 1 illustrates a conventional approach for determining a digital word for an analog equivalent using a pipeline A/D converter.
Figure 2:
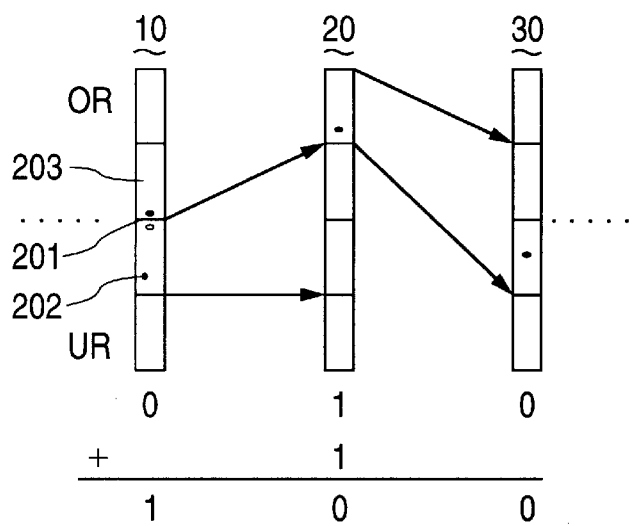
FIG. 2 illustrates the effect of a comparator offset or incomplete settling in the determination of the digital word as shown in FIG. 1.
Figure 3:
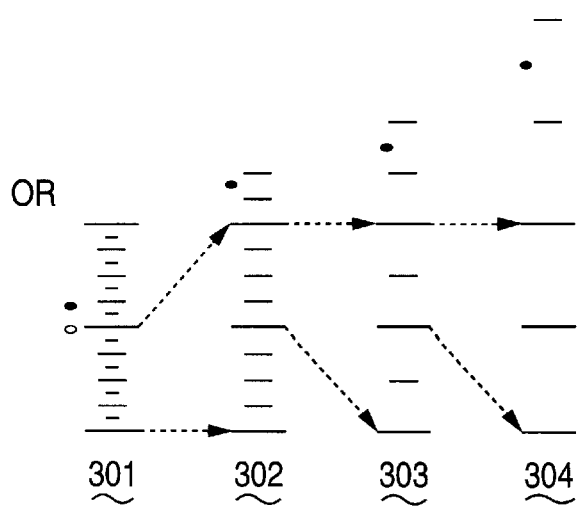
FIG. 3 illustrates the enlargement of the error through the stages prior to the error correction stage due to interstage gains.
Figure 4:
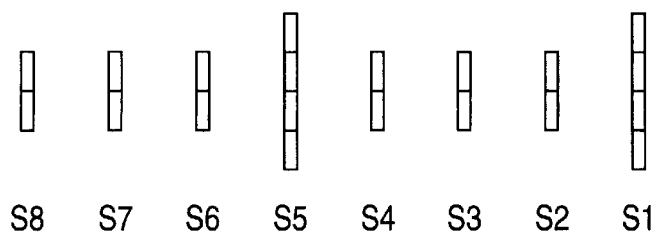
FIG. 4 illustrates error correction in a pipeline A/D converter architecture in accordance with one embodiment of the present invention.

FIG. 4 illustrates a simplified representation of error correction in a pipeline A/D converter architecture in accordance with one embodiment of the present invention. As shown, there are two error correction stages s5 and s1 within the 8-bit pipeline A/D converter architecture. Offset errors accumulate as the signal passes from stage s8 to the last stage s1 of the pipeline architecture. As the fourth stage s5 is configured to be an error correction stage, the error accumulated during stage s8 through s6 is corrected at error correction stage s5 (i.e., the accumulated error is "dumped"). Moreover, at stage s4, the errors begin accumulating once again through to stage s2. The final stage s1 of the pipeline architecture is another error correction stage. As with error correction stage s5, error correction stage s1 corrects for the error accumulated after error correction stage s5, i.e., during stages s4 through s2. In this manner, the error is maintained within a certain limit of the over-range region.

Figure 5:
FIG. 5 illustrates error correction in a pipeline A/D converter architecture in accordance with another embodiment of the present invention.

FIG. 5 illustrates a simplified representation of the error correction in a pipeline A/D converter architecture in accordance with another embodiment of the present invention. As shown, there are provided three error correction stages s7, s4 and s1. As with the previous embodiment, the last stage s1 is an error correction stage. Accordingly, the accumulated error at stage s8 is corrected at error correction stage s7, while the errors accumulated after error correction stage s7 (i.e., stages s7 through s5) are corrected at error correction stage s4. Moreover, errors accumulated after error correction stage s4 (i.e., stages s4 through s2) are corrected at error correction stage s1.

As can be seen, the embodiment of the present invention as illustrated in FIG. 5 maintains errors deviating less into the over-range region since there are three error correction stages (stages s7, s4 and s1) as compared with the embodiment of the present invention as illustrated in FIG. 4 which has two error correction stages. The presence of error correction at the last stage (stage 1) allows a simpler error tolerant design towards the end of the pipeline architecture (for example, at stages 4–2 of FIG. 4, and at stages 3–2 of FIG. 5).

Figure 6:
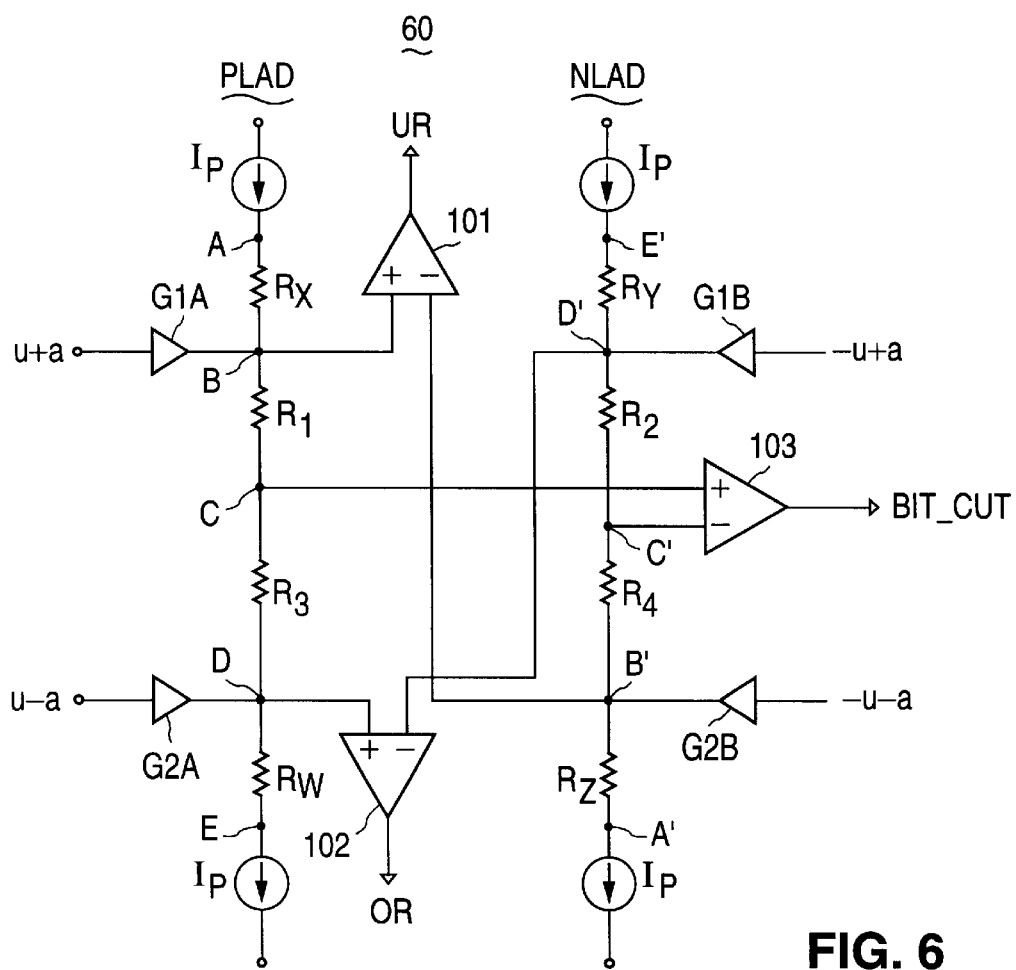
FIG. 6 illustrates a detailed schematic of error detection and correction in a pipeline A/D converter architecture in accordance with one embodiment of the present invention.

FIG. 6 illustrates a simplified diagram of an error correction stage in the pipeline A/D converter architecture in accordance with one embodiment of the present invention. As shown, there is provided a differential resistor ladder structure 60 including a positive ladder PLAD and a negative ladder NLAD. An error correction section is defined by resistors Rx, Ry, Rw and Rz.

Accordingly, differential signals u and −u are received from the previous stage of the pipeline architecture. The signals are already shifted by a constant (a) to four different levels, u+a, u−a, −u+a, and −u−a. These levels are impressed on the ends of two ladders by amplifiers $G_{1A}$, $G_{1B}$, $G_{2A}$ and $G_{2B}$. As the signal u increases, which in turn, means that the opposing signal −u is decreasing, the signal at the positive ladder PLAD rises to a higher potential and the signal at the negative ladder NLAD decreases to a lower potential. On the other hand, when the signal u decreases, the opposite is true: the signal at the positive ladder PLAD sinks down in potential and the signal at the negative ladder NLAD rises higher.

Under ideal operating conditions, (i.e., no errors) only the 1-bit section defined by resistors R1 through R4 predominantly impact the operation of this stage. When the signal u is at its minimum level (i.e., u=−a, as negative as allowed in the design), the voltages at nodes B and B' are equal, i.e., (u+a)=(−u −a)=0. Node C is always at a lower potential than node B due to the voltage drop across resistor R1 caused by the current source Ip. Similarly, the potential at node C' is always higher than that of node B'. Therefore, node C is at a lower voltage than node C' and comparator 103 sets digital output BIT-OUT to logic zero ("0"). The node voltages at nodes B, B' C and C' are then passed onto the next stage (not shown) in the pipeline architecture by using gain blocks similar to $G_{1A-B}$ and $G_{2A-B}$ (see also FIG. 7).

As the signal u increases, the signal at the positive ladder PLAD increases against the signal at the negative ladder NLAD. At a given point during the increase of the input signal u, the voltage at node C exceeds the voltage at node C', and digital output BIT—OUT changes from logic zero ("0") to logic one ("1"). Then, the node voltages at nodes C, C' D and D' are passed onto the next stage. When the input signal u reaches its maximum level (i.e., u=a), the voltages at nodes D and D' are equal. Until the level of input signal u reaches this level, the voltage at node D is always lower than the voltage at node D'.

With a positive constant error added to the input signal u, as the input signal u approaches its maximum level (i.e., u=a), the voltage at node D starts rising beyond the voltage at node D'. This leads to the error correction section defined by resistors Ry and Rw.

At the error correction section, an over range comparator 102 is triggered and an over-range condition is detected. Upon the triggering of the over-range comparator 102 and the detection of the over-range condition, on the analog side, the node voltages D, D', E and E' are passed onto the next stage to place the signal back within the normal range. On the digital side, a one (1) is added to the digital output BIT—OUT.

Similarly, an under-range error occurs when the voltage at node B is lower than the voltage at node B' such that an under-range comparator 101 is triggered. In this case, a "1" is subtracted from the digital output BIT—OUT and the voltages at nodes A, A', B and B' are transferred to the subsequent stage in the pipeline architecture.

The following Table 1 illustrates the appropriate ranges across the ladder structure as illustrated in FIG. 6 that is to be transferred to the subsequent stage of the pipeline architecture.

TABLE 1

Signal Range to be Transferred.

| Signal (u) | BIT_OUT | UR | OR | Voltage Range For Transfer |
|---|---|---|---|---|
| u < −FS | 0 | 1 | 0 | AB and A'B' |
| −FS < u < 0 | 0 | 0 | 0 | BC and B'C' |
| 0 < u < FS | 1 | 0 | 0 | CD and C'D' |
| u > FS | 1 | 0 | 1 | DE and D'E' | where FS is the full scale signal, BIT—OUT is the digital output, UR="1" indicates an under-range condition, and OR="1" indicates an over-range condition.

While FIG. 6 illustrates a 1-bit stage pipeline A/D converter architecture with 1-bit error correction, in accordance with one embodiment of the present invention, 2–4 bits per stage pipeline A/D converter architecture with 1–2 error correction bits can also be implemented. In particular, in accordance with another embodiment of the present invention, given a 2-bit error correction section with two additional over-range comparators and resistors Ry2, Rx2, Rz2, and Rw2, a zero (0), one (1) or two (2) can be added to or subtracted from the digital output BIT—OUT. On the analog side, the appropriate signal range on the ladder, chosen by the triggered over-range comparator, is transferred onto the next stage of the pipeline architecture.

Figure 7:
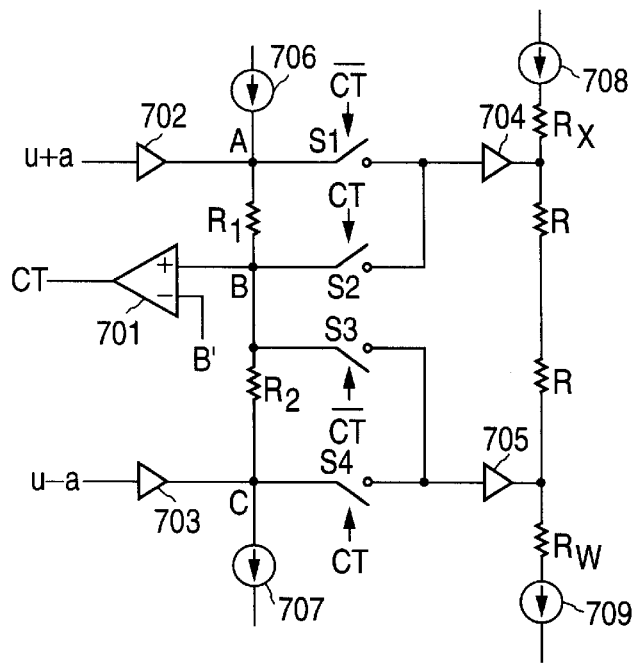
FIG. 7 illustrates a non-error correction stage coupled to an error correction stage in accordance with one embodiment of the present invention.

FIG. 7 illustrates a non-error correction stage which is coupled to an error correction stage in accordance with one embodiment of the present invention. While FIG. 7 shows a single-ended structure, the equivalent differential structure can easily be constructed with a second symmetrical side.

As shown, there are provided a comparator 701, amplifiers 702–705, a plurality of switches S1–S4, current sources 706–709, and resistors R1 and R2. As previously discussed, the signal is impressed upon nodes A and C of the first stage of the pipeline architecture. The current sources 706, 707 provide bias current for the resistor ladder such that amplifiers 702, 703 can apply the input signal to nodes A and C without having to provide any output current. The comparator 701 monitors the voltages at nodes B and B'.

When the input signal is low, node B' is higher than node B so that the output CT of the comparator 701 is logic "0". As a result, switches S1 and S3 are closed and signal range A–B is transferred onto the second stage (for example, the embodiment as illustrated in FIG. 6) of the pipeline architecture using amplifiers 704, 705. The current sources 708, 709 in the second stage not only provide bias for the resistive ladder as previously explained, but also form an error detection section by causing a voltage decrease over the resistors Rx, Rw, and, as a result, extend the normal range ladder. As the input signal u increases, the voltage at node B increases to a higher voltage than that of node B'. The comparator 701 output CT goes high (logic 1), turning switches S1, S3 off, and turning switches S2, S4 on. Then, the signal range B-C is transferred onto the next stage.

In the manner described above, the analog signal is transferred using switches S1 through S4. These switches S1–S4 are, in turn, controlled by the comparator output CT. The appropriate ranges to be transferred, in turn, are signal range B-C for comparator output CT of one "1" and signal range A-B for comparator output CT of zero "0".

Figure 8:
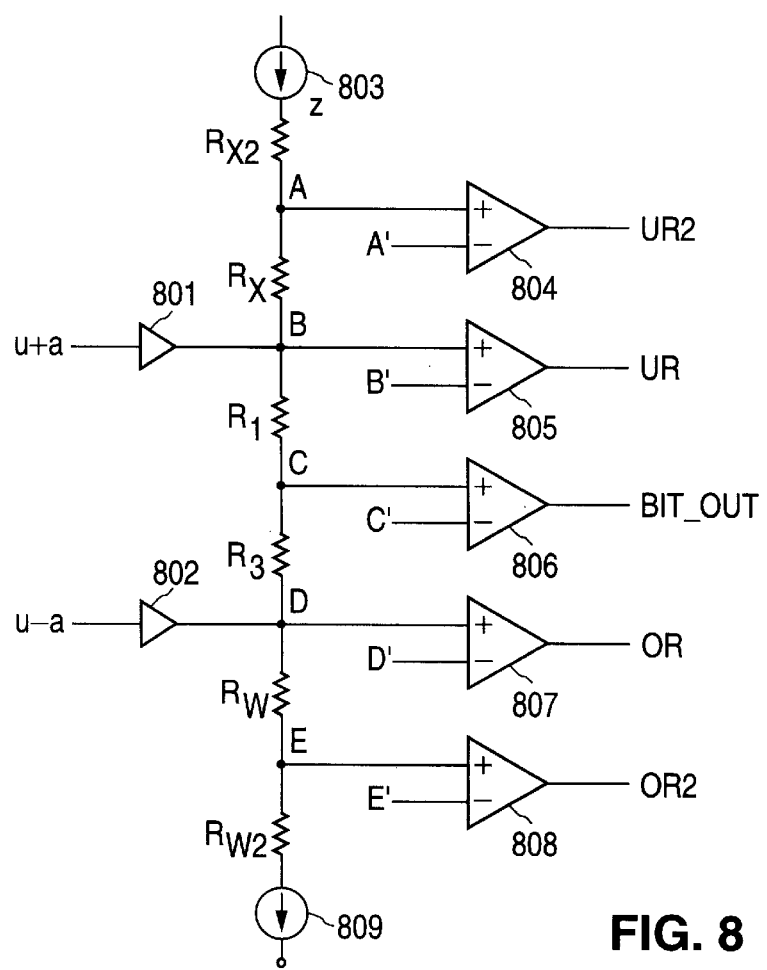
FIG. 8 illustrates a 1-bit per stage structure with 2 bits of error correction in accordance with one embodiment of the present invention.

FIG. 8 illustrates a 1-bit per stage structure with 2 bits of error correction in accordance with another embodiment of the present invention. Again, as shown, FIG. 8 is limited to a single-sided structure for simplicity. However, a differential structure having a second symmetrical side can easily be constructed without exceeding the scope of the present invention.

As shown, there are provided amplifiers 801, 802, current sources 803, 809, a plurality of resistors Rx2, Rx, R1 R3, Rw and Rw2 coupled in series, under range comparators 804, 805, output comparator 806, and over-range comparators 807, 808. Amplifiers 801, 802 operate in a similar manner as amplifiers 702–705 of FIG. 7. Resistors R1 and R3 establish the normal signal range. Comparator 806 evaluates the signal in the normal range: if the voltage at node C is higher than that at node C', then the digital output BIT—OUT is logic "1", otherwise it is logic "0". Resistors Rx and Rw, along with current sources 803, 809, establish the first level under-range and over-range conditions, respectively, which are detected by comparators 805 and 807.

A second level of error detection/correction is added by incorporating resistors Rx2 and Rw2 at the ends of the ladder structure of FIG. 8. This results in a "wider reaching" error correction stage. For example, a comparator offset at a prior stage causes an error such that when the input signal u is at the maximum allowable level, the voltage at node D increases the a higher level than the voltage at node D' (instead of being less than or equal thereto). As a result, output OR of over-range comparator 807 goes high, signalling an over-range condition.

If the error is sufficiently small, the voltage at node E is still lower than the voltage at node E'. Output OR2 of the second level over-range comparator 808 is at logic "0" and signal range D-E is transferred to the next stage through the mechanism previously described, and a logic of "1" is added to the digital output BIT—OUT. If the error is large, however, then not only is the voltage at node D higher than that at node D', but also, the voltage at node E is higher than that at E'. The output of the second level over-range comparator 808 goes high, signalling over-range condition at the second level. Signal range E-F is then transferred and a "2" is added to the digital output BIT—OUT. In other words, the signal is found to be two local quantization steps away from the normal range.

It is apparent from the foregoing that in accordance with the present invention, other error correction resolution for pipeline architecture is possible, such as a 2-bit stage with a 2 bit error correction.

Figure 9:
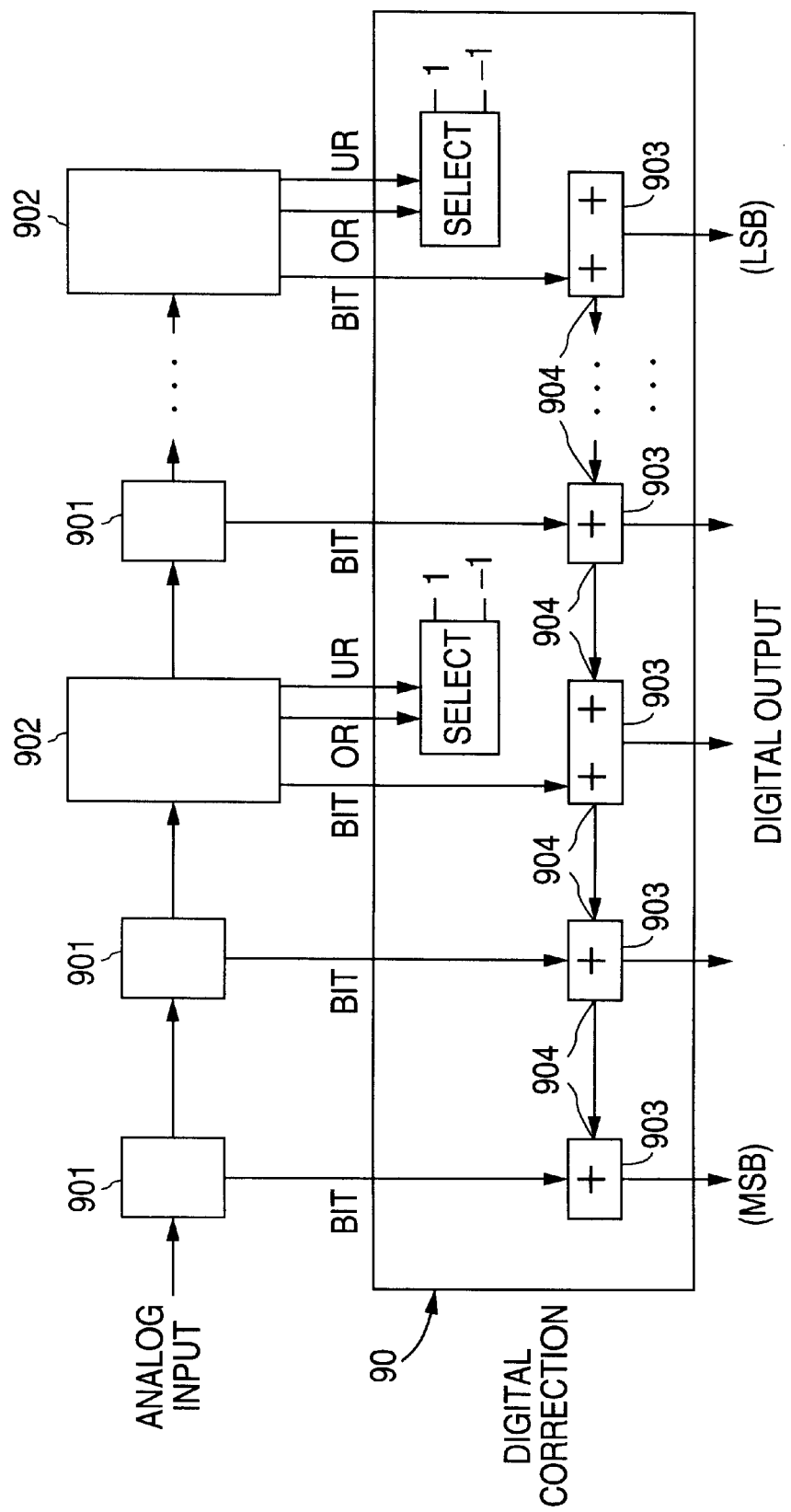
FIG. 9 illustrates a 1-bit per stage pipeline A/D converter architecture with 1-bit error correction stages in accordance with one embodiment of the present invention.

FIG. 9 illustrates the overall architecture for a 1-bit per stage pipeline structure with 1-bit error correction stages in accordance with the present invention. As shown, there are provided a plurality of non-error correction stages 901 and error detection and correction stages 902 (of FIGS. 6 and 8). Also shown in FIG. 9 is a digital correction section 90 coupled to each stage (both error correction and non-error correction stages of the pipeline architecture) for receiving the uncorrected digital signal from each stage 901, 902, and over-range information from stage 902 in order to generate the corrected digital output. At the digital output of each stage 902, a selection is made to add "1", "−1", or "0" for error correction. The binary adders 903 are connected to each other through carry-in and carry-out ports 904.

Optimal placement of the error correction (EC) stages requires prior knowledge of the worst case errors. Given an 8-bit pipeline architecture comprising eight 1-bit stages (i.e., stage 8 (MSB), . . . , stage 1 (LSB)), and further given that all stages except stage 8 (MSB) are error correction stages each having correction capability of 1 local bit, one bit error correction would provide only one segment on each side of the normal range (as previously defined), one segment for over-range condition and one segment for under-range condition.

Stage 8 (MSB) cannot be an error correction stage since it is the first stage of the pipeline architecture where the input signal is received. The last stage of the pipeline architecture, stage 1, can correct errors of up to 1 LSB. One local bit at stage 2 is twice as large as that of stage 1 (i.e., 2 LSBs). Hence stage 2 can correct errors of up to 2 LSBs. Similarly, stage 3 can correct up to 4 LSBs, and so on. Therefore, for a 1-bit stage pipeline architecture, stage k can correct errors up to $2^{(k-1)}$ LSBS. It is to be noted that, in practice, this can be extended to multi-bit stages.

Given that each stage of the pipeline architecture can add its own comparator offset and settling error, $e2$, ... $e8$, these errors, if uncorrected, will accumulate to create local errors of $E1$, ... $E7$ which can be further defined by the following expressions:

$E7 = e8$ $E6 = e8 + e7/2$ $E5 = e8 + e7/2 + e6/4$ $E1 = e8 + e7/2 + e6/4 + e5/8 + e4/16 + e3/32 + e2/64$

Moreover, due to the interstage gains of 2, errors at each successive stage are amplified accordingly. Also, to be correctable, a cumulative error needs to be smaller in magnitude than the local bit size of that stage. For the example above, the following condition needs to be satisfied: E7<64 LSBs, E6<32 LSBs, E5<16 LSBs, . . . , E1<1LSB. Therefore, it can be determined that for a high resolution pipeline architecture (for example, 12 bits or higher), it is not possible to satisfy E1<1 LSB. Thus, a correction within the pipeline architecture is necessary.

Once it is decided that a correction is necessary, it is possible to determine the optimal placement of the error correction stages within the pipeline architecture using the expressions above. For example, in the previous case of 8-bit pipeline architecture, assuming that all the comparator offset and settling errors at each stage e2, . . . , e8 are equal to 6 LSBs, the accumulated errors E7, . . . , E1 can be determined as follows. Accumulated error at the second stage of the pipeline (stage 7) E7 =e8 =6, which is less than 64 LSBs. Therefore error correction at this stage is not optimal. Next, the accumulated error at the third stage (stage 6) E6 =e8+e7/2=6+3 =9, which is less than 32 LSBs. Again, error correction at this stage is not optimal. Then, the accumulated error at the fourth stage (stage 5) E5=e8+e7/2+e6/4=6+3+1.5=10.5, which is less than 16 LSBs. Thus, as with the previous stages, error correction at this stage is not optimal. However, the accumulated error at the fifth stage (stage 4) E4=e8+e7/2+e6/4+e5/8=6+3+1.5+0.75=11.25, which is not less than 8 LSBs. Therefore, given this 8-bit pipeline architecture with comparator offset and settling errors at each stage of 6 LSBs, the fifth stage of the pipeline architecture should be an error correction stage.

As before, the stage at the end of the pipeline, stage 1, is also an error correction stage in order to correct errors that accumulate through stages 4-1.

Figure 10A:
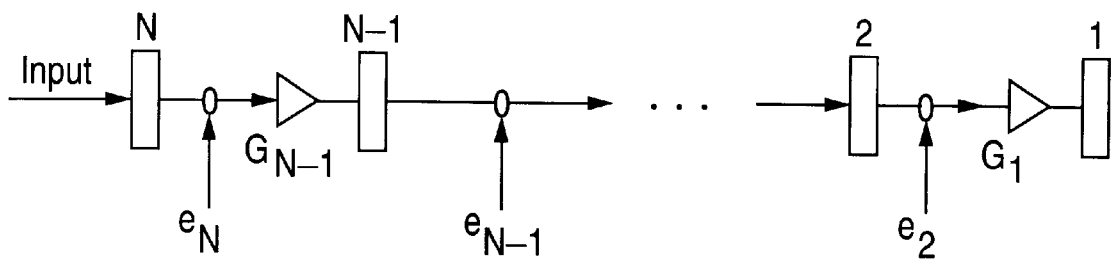
FIGS. 10A–10B are a block diagram of a pipeline A/D converter architecture and a flowchart for optimizing the placement of error correction stages in a pipeline A/D converter architecture respectively, in accordance with one embodiment of the present invention.
Figure 10B:
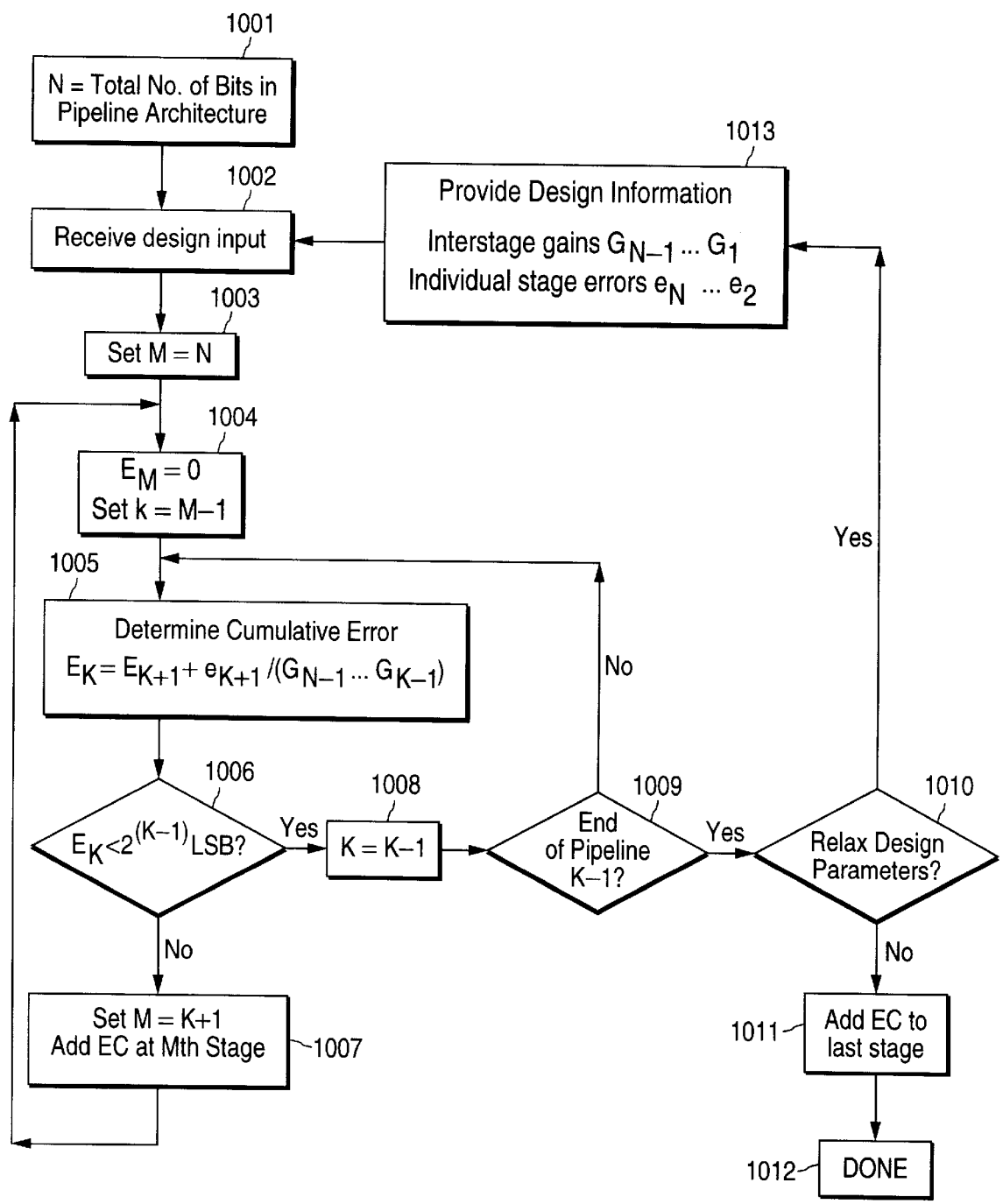

FIGS. 10A and 10B are a block diagram of an A/D converter architecture and a flowchart for optimizing the placement of error correction stages in an A/D converter architecture respectively, in accordance with one embodiment of the present invention using 1 bit/stage. For an N-bit converter, the input is received at the Nth stage, and the last stage of the converter is labeled as stage 1. Moreover, the errors from the individual stages are treated as additive terms between the stages.

As shown, the total number of bits N in the pipeline architecture is first set at step 1001. Then, at step 1002, pipeline architecture design parameters are received including the number of bits per stage, interstage gains, and anticipated error sources. A variable M is used as a pointer that marks the beginning of a group of subsequent sections of the pipeline architecture that do not include any error correction. Thereafter, an iteration is commenced at step 1003 for determining cumulative error in the pipeline at each stage by first initializing the variable M to the first stage N. At step 1004, the accumulated error $E_M$ is initialized to zero (0) since there would be no accumulated error at the first stage of the pipeline. Also at step 1004, a second variable k is set to M--1 to determine the accumulated error at the next stage $E_K$ at step 1005 in the manner discussed previously. Then, the accumulated error $E_K$ is compared with what that stage can correct if a 1 bit error correction were used. If the accumulated error is not within the bounds of that stage's local error correction capability, then, at step 1007, it is determined that the prior stage should be an error correction stage. At this point, the total error in the pipeline is set to zero since it is assumed to be corrected, and the error accumulation process starts again with the stage following the new error correction stage.

If, on the other hand, at step 1006, it is determined that the cumulative error $E_K$ is less than that stage's local error correction capability, no error correction is designed into that stage., thus indicating that error correction is not necessary. The subsequent stages in the pipeline are similarly analyzed by way of step 1008 and 1009.

When the last stage of the pipeline architecture is reached, it is determined whether to modify the design parameters to further implement power and chip area savings. In other words, it is determined at step 1010 whether the design parameters is to be relaxed. If the design parameters need not be relaxed, then, at step 1011, the last stage of the pipeline architecture is configured as an error correction stage, and thus completing the pipeline architecture design process at step 1012.

It, however, is determined at step 1010 that the design parameters is to be relaxed, then, at step 1013, a suitable design information is provided to step 1002, and the configuration of the architecture design is repeated.

As previously discussed, the nonlinearity of the interstage gain block, operating in the over-range region can be of concern. In accordance with the present invention, the comparison at step 1006 can be made more generally by including a proportionality constant (for example, the accumulated error $E_{K<}(\alpha*2^{(K-1)}) * LSB$, where $\alpha$ is between zero and one). In this manner, it is possible to set the error correction level to a certain fraction, instead of the full value, of the local error correction capability.

In the manner described above, the present invention brings flexibility into the pipeline A/D converter architecture design by accumulating errors in successive stages and correcting the errors at selected, optimal stages within the pipeline architecture. Additionally, by designing the architecture such that the last stage of the pipeline architecture is an error correction stage, simpler pipeline section design towards the end of the pipeline is achieved while still avoiding accumulating unnecessary differential linearity errors. Thus, in accordance with the present invention, pipeline architecture design is optimized resulting in power and silicon area savings.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of error correction in a pipeline analog to digital converter, comprising the steps of:

receiving an input signal;

detecting said input signal relative to a predetermined signal range and in accordance thereto, generating a plurality of detection signals, said plurality of detection signals including an upper range detection signal, an under range detection signal and an in-range detection signal; and selectively receiving one of said upper range, under range or in-range detection signals and in accordance thereto, providing an output signal;

wherein said step of selectively receiving one of said upper range, under range or in-range detection signals includes the step of accumulating error signals at each successive stages of said pipeline and periodically performing error correction of said input signal in accordance with said plurality of detection signals and accumulated error signals.

2. The method of claim 1 wherein said step of detecting said input signal includes the steps of:

detecting a first upper range condition and in accordance thereto generating a first upper range detection signal; and detecting a first under range condition and in accordance thereto generating a first under range detection signal;

wherein said upper range detection signal includes said first upper range detection signal and said under range detection signal includes said first under range detection signal; and further wherein said first upper range condition is defined by one of said input signal above said predetermined signal range, and said first under range condition is defined by another one of said input signal below said predetermined signal range.

3. The method of claim 2 wherein said steps of detecting said first upper range condition and detecting said first under range condition include using a plurality of comparators.

4. The method of claim 2 wherein said step of detecting said input signal includes the steps of:

detecting a second upper range condition and in accordance thereto generating a second upper range detection signal; and detecting a second under range condition and in accordance thereto generating a second under range detection signal;

wherein said upper range detection signal includes said second upper range detection signal and said under range detection signal includes said second under range detection signal; and further wherein said second upper range condition is defined by one of said input signal above said first upper range detection signal, and said second under range condition is defined by another one of said input signal below said first under range detection signal.

5. The method of claim 4 wherein said steps of detecting said second upper range condition and detecting said second under range condition include using a plurality of comparators.

6. The method of claim 1 wherein said step of detecting said input signal includes coupling a first resistive ladder to a second resistive ladder.

7. The method of claim 1 wherein said accumulated error signals are initialized when error correction to said input signal is performed.

8. An apparatus for error correction in a pipeline analog to digital converter, comprising:

an input terminal for receiving an input signal; a plurality of stages including a first stage coupled to said input terminal and a last stage, said last stage configured to be an error correction stage;

wherein when said input signal is detected relative to a predetermined signal range, a plurality of detection signals are generated, said plurality of detection signals including an upper range detection signal, an under range detection signal and an in-range detection signal; and further wherein when said one of said upper range, under range or in-range detection signals are selectively received, error signals are accumulated at each successive stages of said pipeline and error correction of said input signal is periodically performed in accordance with said plurality of detection signals and accumulated error signals to generate an output signal.

9. The apparatus of claim 8 wherein said input signal is detected by detecting a first upper range condition and in accordance thereto generating a first upper range detection signal, and detecting a first under range condition and in accordance thereto generating a first under range detection signal;

wherein said upper range detection signal includes said first upper range detection signal and said under range detection signal includes said first under range detection signal; and further wherein said first upper range condition is defined by one of said input signal above said predetermined signal range, and said first under range condition is defined by another one of said input signal below said predetermined signal range.

10. The apparatus of claim 9 further including a plurality of comparators configured to detect said first upper range condition and said first under range condition.

11. The apparatus of claim 9 wherein said input signal is detected by detecting a second upper range condition and in accordance thereto generating a second upper range detection signal, and detecting a second under range condition and in accordance thereto generating a second under range detection signal;

wherein said upper range detection signal includes said second upper range detection signal and said under range detection signal includes said second under range detection signal; and further wherein said second upper range condition is defined by one of said input signal above said first upper range detection signal, and said second under range condition is defined by another one of said input signal below said first under range detection signal.

12. The apparatus of claim 11 further including a plurality of comparators for detecting said second upper range condition and said second under range condition.

13. The apparatus of claim 9 further including a first resistive ladder coupled to a second resistive ladder for detecting said input signal.

14. The apparatus of claim 8 wherein said accumulated error signals are initialized when error correction to said input signal is performed.

* * * * *